(12) United States Patent
Wenzel et al.

(10) Patent No.: US 12,435,386 B2
(45) Date of Patent: Oct. 7, 2025

(54) INTERMEDIATE HEATING STATION WITH SUPPORT PROJECTIONS ON LOWER MASK

(71) Applicant: Automation, Press and Tooling, AP & T AB, Tranemo (SE)

(72) Inventors: Björn Wenzel, Ulricehamn (SE); Drazen Klint, Ulricehamn (SE); Marcus Leander, Blidsberg (SE)

(73) Assignee: Automation, Press and Tooling, AP & T AB, Tranemo (SE)

( * ) Notice: Subject to any disclaimer, the term of this patent is extended or adjusted under 35 U.S.C. 154(b) by 911 days.

(21) Appl. No.: 17/634,801

(22) PCT Filed: Jul. 30, 2020

(86) PCT No.: PCT/EP2020/071478
§ 371 (c)(1),
(2) Date: Feb. 11, 2022

(87) PCT Pub. No.: WO2021/028230
PCT Pub. Date: Feb. 18, 2021

(65) Prior Publication Data
US 2022/0340995 A1    Oct. 27, 2022

(30) Foreign Application Priority Data
Aug. 14, 2019 (EP) ..................... 19191711

(51) Int. Cl.
*C21D 9/54* (2006.01)
*B21D 37/16* (2006.01)
(Continued)

(52) U.S. Cl.
CPC .............. *C21D 9/54* (2013.01); *B21D 37/16* (2013.01); *C21D 1/34* (2013.01); *C21D 1/673* (2013.01);
(Continued)

(58) Field of Classification Search
CPC ... C21D 9/54; C21D 9/46; C21D 1/34; C21D 1/673; C21D 2211/001; C21D 2211/002;
(Continued)

(56) References Cited

U.S. PATENT DOCUMENTS 8,847,126 B2    9/2014 Ishiguro et al.
2015/0016810 A1    1/2015 Mineoka
(Continued)

FOREIGN PATENT DOCUMENTS

CN    107828954 A    3/2018
DE    202012007777 U1    9/2012
(Continued)

OTHER PUBLICATIONS

International Search Report and Written Opinion for International Application No. PCT/EP2020/071478, mailed Oct. 2, 2020, (7 pages).
(Continued)

*Primary Examiner* — John P. Dulka
(74) *Attorney, Agent, or Firm* — Kagan Binder, PLLC

(57) ABSTRACT

A heating station (1) for heating a metal sheet blank (50) and a system comprising such a heating station (1), is herein disclosed. In particular, the heating station comprises lower or upper heating elements (11) arranged in a heating chamber (10) below a metal sheet blank (50) when in a heating position, and configured to provide radiation heating towards the metal sheet blank (50), and a lower mask (14) arranged to block radiation heating from reaching at least a first portion of the metal sheet blank (50), wherein the lower mask (14) comprises a plurality of support projections (14d) projecting from a main surface (14a) of the lower mask (14) towards the metal sheet blank (50) when in a heating position, which support projections (14d) are configured to support a metal sheet blank (50) during heating thereof.

16 Claims, 8 Drawing Sheets

(51) Int. Cl.
- *C21D 1/34* (2006.01)
- *C21D 1/673* (2006.01)
- *C21D 7/13* (2006.01)
- *C21D 9/00* (2006.01)
- *C21D 9/46* (2006.01)
- *F27D 5/00* (2006.01)
- *F27D 9/00* (2006.01)
- *H05B 3/00* (2006.01)

(52) U.S. Cl.
CPC .............. *C21D 7/13* (2013.01); *C21D 9/0025* (2013.01); *C21D 9/46* (2013.01); *F27D 5/0062* (2013.01); *H05B 3/0061* (2013.01); *C21D 2211/001* (2013.01); *C21D 2221/00* (2013.01); *F27D 2009/0002* (2013.01)

(58) Field of Classification Search
CPC ........ C21D 2211/008; C21D 2211/009; C21D 2221/00; B21D 37/16; H05B 3/0061; F27D 2009/0002; F27D 11/12
See application file for complete search history.

(56) References Cited

U.S. PATENT DOCUMENTS

2015/0377556 A1* 12/2015 Ishiguro .................. C21D 9/46
                                                               266/249
2017/0144207 A1    5/2017 Trippe et al.

FOREIGN PATENT DOCUMENTS

| | | | |
|---|---|---|---|
| EP | 2463395 A1 | 6/2012 | |
| EP | 3037186 | 6/2016 | |
| EP | 3156506 A1 | 4/2017 | |
| JP | 2010044875 A * | 2/2010 | ............... C21D 1/09 |
| JP | 2013124408 A | 6/2013 | |
| JP | 2018193589 A * | 12/2018 | |

OTHER PUBLICATIONS

E-Spacenet English Abstract for DE 202012007777 U1.
E-Spacenet English Abstract for EP 3037186 A2.
Japanese Office Action, and English Translation therefore, for Japanese Counterpart Application No. 2022-507595, mailed Jun. 18, 2024. (11 pages).

* cited by examiner

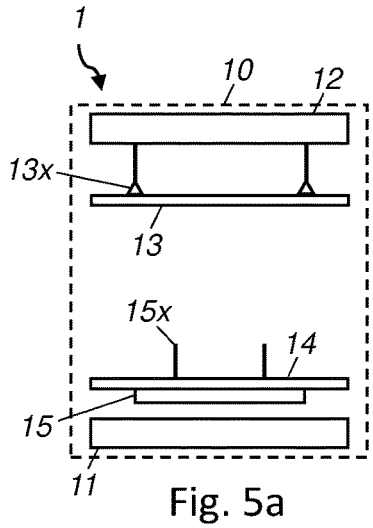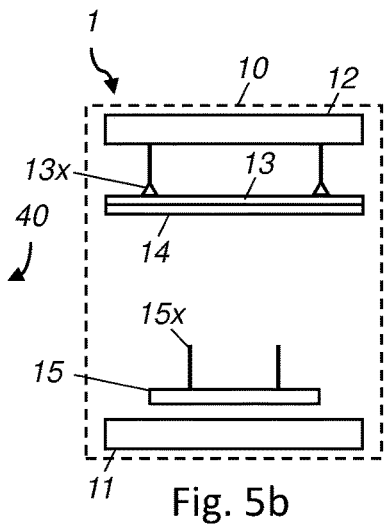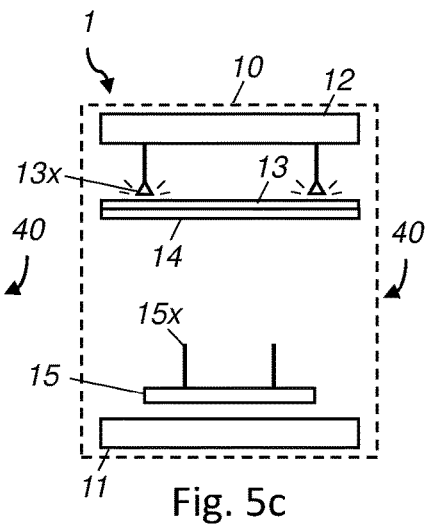
Fig. 5a  Fig. 5b  Fig. 5c
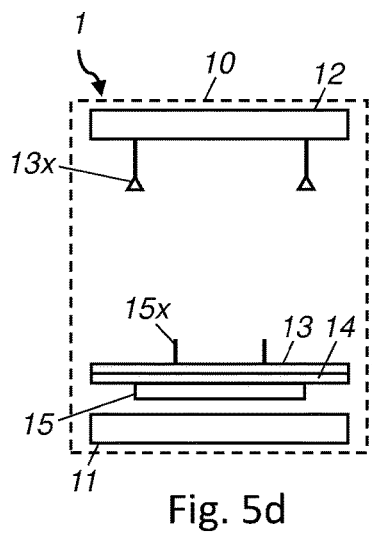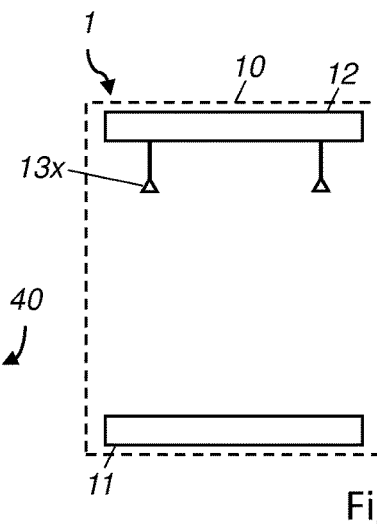
Fig. 5d  Fig. 5e
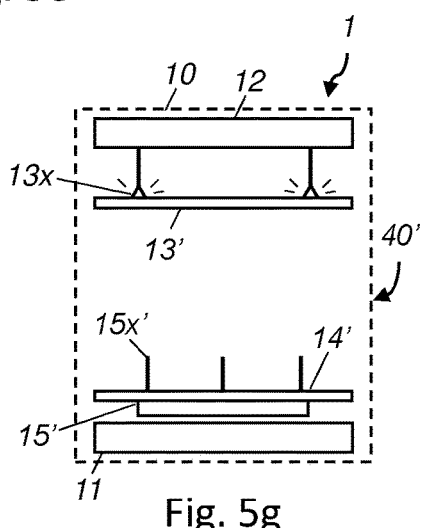
Fig. 5f
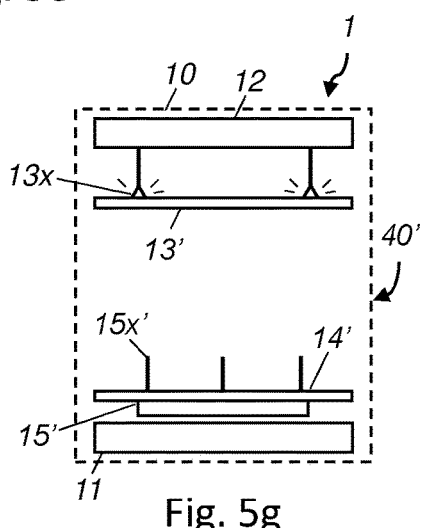
Fig. 5g

INTERMEDIATE HEATING STATION WITH SUPPORT PROJECTIONS ON LOWER MASK

CROSS-REFERENCE TO RELATED APPLICATIONS

This application claims priority to International Application No. PCT/EP2020/071478, filed Jul. 30, 2020 and titled "INTERMEDIATE HEATING STATION," which in turn claims priority from a European Patent Application having Ser. No. 19/191,711.1, filed Aug. 14, 2019, titled "INTERMEDIATE HEATING STATION," both of which are incorporated herein by reference in their entireties.

TECHNICAL FIELD

The present disclosure relates to an arrangement and a method for production of partial press hardened parts, and especially to an arrangement and a method for controlling heating of a metal blank sheet.

BACKGROUND

Normally, press hardened parts show a uniform strength distribution. Especially for safety relevant parts with high requirements concerning crash performance, this uniform strength distribution can cause problems. For instance, a B-pillar can during a crash absorb more energy if its lower part is relatively more flexible than the middle and upper part which are usually designed to be high-tensile to prevent the intrusion into the passenger compartment.

Technologies such as tailored rolled blanks, tailored welded blanks, tailored tempering, and tailored heating are used to create soft/hard-zones within press hardened parts. However, these technologies can only tailor material properties in big areas. Moreover, the technologies of tailored rolled blanks and tailored welded blanks come with a few issues: expensive tooling (needs good contact pressure), process control (due to tight process window). Tailored tempering in the tool also come with a few issues: part distortion after rejecting the parts, high tool wear, high tool cost. Tailored heating with existing technologies also come with a few issues: large transition zones, reproducibility, process costs, only for big areas of parts (e.g. ⅓ of a B-pillar).

Hence, there is a need for an improved solution which alleviates at least some of the issues mentioned above.

SUMMARY

It is an object of the present invention to provide an improved solution that alleviates the mentioned drawbacks with present solutions. Furthermore, it is an object to provide a heating station for heating a sheet metal blank, which heating station allows for a more controlled and precise heating of said sheet metal blank. Moreover, it is an object to provide a method for heating a sheet metal blank, which method allows for a more controlled and precise heating of said sheet metal blank.

The invention is defined by the appended independent claims, with embodiments being set forth in the appended dependent claims, in the following description and in the drawings.

According to a first aspect of the invention, a heating station for heating a metal sheet blank is provided. The heating station may comprise a heating chamber. The heating station may comprise lower or upper heating elements arranged in the heating chamber below or above the metal sheet blank when in a heating position. The heating elements may be configured to provide radiation heating towards the metal sheet blank. The heating station may comprise a lower mask arranged in the heating chamber below the metal sheet blank when in a heating position. The lower mask may be adapted in shape and size to block the radiation heating from reaching at least a first portion of the metal sheet blank. The lower mask may be adapted in shape and size to allow radiation heating to reach at least a second portion of the metal sheet blank and heat the same. The lower mask may comprise a plurality of support projections projecting from a main surface of the lower mask towards the metal sheet blank when in a heating position. The support projections of the lower mask may be configured to support a metal sheet blank during heating thereof.

By this heating station, soft and hard zones may be created either very locally, or in large areas within the produced press hardened components. This heating station also enables production of structural car body components with a new crash path design.

By adapted in shape and size, it may mean that the lower mask has at least one opening or recess. It may also mean that the lower mask has a planar extension not able to block some heating radiation from reaching at least one portion of the metal sheet blank.

The heating chamber may be a framework that holds thermal insulation and heating elements. Moreover, the heating chamber may comprise a first openable hatch through which a metal sheet blank may be inserted into the heating chamber and removed from the heating chamber. Moreover, the heating chamber may comprise a second openable hatch. The first hatch may be a front hatch, arranged on a front side of the heating chamber. The second hatch may be a rear hatch, arranged on a rear side of the heating chamber. The lower mask may be removable or insertable through the rear hatch. The lower mask may be removable or insertable through the front hatch.

The heating elements of the heating station may be electrically powered, or fired with fuels such as gases or oils. The heating elements may be configured to provide heating radiation. The heating radiation may be infrared radiation.

The lower mask may have a substantially planar geometry. The mask may have at least one opening or recess. In the context of masks, opening or recess refers to an aperture or the like extending through a mask, which is either open or closed in a traversal direction. For instance, an opening may be a hole which is fully bounded by the structure of a mask. For instance, a recess may be a gap also extending from an edge of a mask. Any of the masks may be provided with at least one, two, three, four, five, six, seven, eight, nine, ten or more openings or recesses. The opening or recesses may be designed so as to provide a desired heating pattern of a metal sheet blank subjected to heating.

The support projections may in one embodiment project between 0.1-50 mm from the main surface of the lower mask. In another embodiment, the support projections may project between 1-30 mm, preferably between 1-20 mm, from the main surface of the lower mask.

Further, in a heating station, radiation heating from heating elements may reflect against surfaces within the heating chamber; i.e. radiation heating may be reflected towards the metal sheet blank. Thus, in the case of the heating station comprising an upper heating element only, it is understood that the lower mask blocks radiation heating from the upper heating element reflected towards the metal sheet blank.

According to one embodiment, the heating station may comprise a reflecting surface arranged and/or configured to reflect radiation heating towards the metal sheet blank. By this, reflecting radiation heating towards the metal blank sheet may be facilitated. The lower mask may be adapted in shape and size to block the radiation heating reflected from the reflecting surface from reaching at least a first portion of the metal sheet blank. The reflecting surface preferably has a high reflectance, such as a mirror surface or a glossy surface. The reflecting surface may be made of one or more materials, for example Au, Ag or Cu and alloys thereof, i.e. an Au—Ag alloy, an Au—Cu alloy, an Ag—Cu alloy. Such materials may advantageously be used to provide a reflective surface in some embodiments of the invention due to their relatively high reflectance in combination with their relatively high melting point in the range of roughly 960-1080° C., thereby enabling a protective surface which can withstand a wide range of working temperatures in the heating chamber. The reflecting surface may be a coating provided on an element configured to be arranged in the heating chamber arranged below the mask, or a coating disposed on a bottom area of the heating chamber.

According to one embodiment, the heating station may comprise both lower heating elements arranged below a metal sheet blank and upper heating elements arranged above a metal sheet blank when in a heating position, and the heating station may further comprise an upper mask arranged in the heating chamber between the upper heating elements and the metal sheet blank, adapted in shape and size to, when in the heating position, block radiation heating from reaching at least a third portion of the metal sheet blank, and to allow radiation heating to reach at least a fourth portion of the metal sheet blank and heat the same.

The upper mask may be arranged to control the radiation reaching an upper side of the metal sheet blank. By adapted in shape and size, it may mean that the upper mask has at least one opening or recess. It may also mean that the upper mask has a planar extension not able to block some heating radiation from reaching at least one portion of the metal sheet blank.

The upper mask may have a substantially planar geometry. The upper mask may have at least one opening or recess. In the context of masks, opening or recess refers to an aperture or the like extending through a mask, which is either open or closed in a traversal direction. For instance, an opening may be a hole which is fully bounded by the structure of a mask. For instance, a recess may be a gap also extending from an edge of a mask. Any of the masks may be provided with at least one, two, three, four, five, six, seven, eight, nine, ten or more openings or recesses. The opening or recesses may be designed so as to provide a desired heating pattern of a metal sheet blank subjected to heating. The upper and lower masks may be similarly designed with respect to the layout of opening or recesses, so as the at least one first portion and the at least one third portion are aligned of the metal sheet blank over each other.

According to one embodiment, the lower mask may be configured to be operatively moveable from a first position towards a second position. The first position may be a position where the lower mask is in a position closer to the bottom of the heating chamber. The first position may be a position where the lower mask is in a position where a metal sheet blank may be readily inserted into the heating chamber. The metal sheet blank may be received by the lower mask and supported. The lower mask may be operatively movable upwards while supporting the metal sheet blank. The second position may correspond to a heating position, i.e. a position where the metal sheet blank supported on the lower mask is in a heating position. By having the lower mask being operatively moveable, a metal sheet blank may be placed in a heating position where precise heating may be facilitated. Moreover, the movement of the lower mask may be controlled, either manually or automatically. Hence, the heating of a metal sheet blank may be more autonomous. The heating station may comprise a lifting device configured to move the lower mask between the first and second position. The lifting device may be powered by a pneumatic or electric actuator, preferably a servomotor driven linear unit. The actuator may be placed outside the heating chamber. The actuator(s) may be configured to control the lower mask via a support structure. The support structure may reach through a floor section or a side section of the heating chamber. In an embodiment wherein the heating station comprises an upper mask, the movement of the lower mask to the second position may be in a direction towards the upper mask.

According to one embodiment, the lower mask may comprise at least one opening or recess through which radiation heating may reach said at least a second portion of the metal sheet blank and heat the same. Alternatively, the lower mask may be provided without any openings or recesses, wherein the lower mask is limited in planar extension so that it is not able to block some heating radiation from reaching at least one portion of the metal sheet blank and heat the same.

According to one further embodiment, the upper mask may comprise at least one opening or recess through which heating radiation may reach at least a fourth portion of the metal sheet blank and heat the same. Alternatively, the upper mask may be provided without any openings or recesses, wherein the upper mask is limited in planar extension so that it is not able to block some heating radiation from reaching at least one portion of the metal sheet blank and heat the same.

One of the upper and lower masks may comprise at least one opening or recess and the other of the upper and lower mask may be provided without a corresponding at least one opening or recess. By this, a portion of the metal sheet blank may be exposed to radiation heating from only one direction, from above or from below.

The heating chamber may comprise adjusting means for adjusting the upper mask and/or the lower mask in position in the heating chamber, independently from each other, in directions parallel to a horizontal plane. By this, the upper and/or lower mask may be adjusted in position relative each other so as to align any openings or recesses of the upper mask and the lower mask, or position the upper and lower mask to enable targeted radiation heating at zone from only one direction.

According to one embodiment, the upper mask may be stationary in a position while the lower mask may be moveable towards the upper mask carrying the metal sheet blank in a heating position. Optionally, the upper mask may also be configured to be operatively moveable relative the heating chamber of the heating station. The upper mask may then be moveable between a first position and a second position. The upper mask may in the first position be in a locked position, locked in place by locking means. The upper mask may in the second position be supported by the lower mask placed in a first position. In a further exemplary embodiment, the upper mask may be configured to be moveable toward the lower mask while the lower mask moves towards the upper mask while supporting the metal sheet blank. The main surface of the upper mask may be a bottom surface of the upper mask, i.e. a surface facing the metal sheet blank. Moreover, the movement of the upper mask may be controlled by a lifting device similar to one configured to control the movement of the lower mask. The movement of the upper and lower mask may be controlled by the safe lifting device. The lifting device may be powered by a pneumatic or electric actuator, preferably a servomotor driven linear unit.

According to one embodiment, the heating station may comprise support pins extending through said at least one opening or recess in the lower mask. The support pins may be configured to support a metal sheet blank inserted in the heating station. By having support pins, a metal sheet blank may be received by the support pin in such a way so that the lower mask more easily may receive the metal sheet blank. In one embodiment, besides extending through the at least one opening or recess of the lower mask, one or more support pins may be configured to extend through support pin apertures in the lower mask. Hence, if the at least one opening or recess in the lower mask is not enough to support the metal sheet blank when inserted into the heating chamber, support pins may be located at additional locations and extending through dedicated support pin apertures in the lower mask. Such support pin apertures may be tightly configured to only be wide enough for the support pin to extend there through. This may improve stability of the metal sheet blank when inserted into the heating chamber. The heating station may comprise one, two, three, four, five, six, seven, eight, nine, ten, or more support pin(s). The support pin(s) may be arranged to give stability to the metal sheet blank when inserted into the heating chamber. Moreover, the heating chamber may comprise a support shelf configured to provide stability to the metal sheet blank when inserted into the heating chamber. The support shelf may be arranged on an inner side of the heating chamber. The support shelf may have an upper surface being at the same vertical level as the tip of the support pins. The support shelf may provide further stability when a metal sheet blank is inserted into the heating chamber, so that it may be more easily received by the lower mask.

According to yet another embodiment, the heating station may be configured to receive a metal sheet blank so that it is supported by said support pins when the lower mask is in the first position. The lower mask may be configured to support the metal sheet blank by the support projections of the lower mask when the lower mask is moved to the second position. By this embodiment, a received metal sheet blank may more accurately be prepared to be supported by the lower mask.

According to yet another embodiment, the upper and lower masks may be made of steel or aluminum. The upper and lower masks may be made of stainless steel. By this embodiment, the heating control of the masks and thereby also the metal sheet blank during heating thereof may be facilitated.

According to yet another embodiment, the upper mask may comprise distance projections projecting from a main surface of the upper mask towards the metal sheet blank when in the heating position. By this embodiment, air may ventilate between the upper mask and the metal sheet blank when in a heating position. The distance projections on the upper mask may be configured to be in contact with the metal sheet blank when in the heating position. The distance projections may project from the main surface of the upper mask in an extent equal to the support projections of the lower mask.

According to yet another embodiment, the upper and lower masks may be exchangeable from the heating station. By this embodiment, the upper and lower mask may be exchanged for a different set having a different size, form, material, and/or layout with respect to layout of the at least one opening or recess of each respective mask. Hence, the same heating station may be reconfigured to heat metal sheet blanks intended to be processed into different types of press hardened parts.

According to yet another embodiment, the support pins may be arranged on a support structure. By this embodiment, the support pins may be more adapt at managing the weight of a metal sheet blank placed on top of the support pins.

According to yet another embodiment, the support structure may be exchangeable from the heating station. By this embodiment, the support pins may be arranged with a greater degree of freedom with a layout only having to correspond to a particular lower mask. Moreover, the lower mask, as well as the support structure, may be exchanged simultaneously, or in succession of each other.

According to yet another embodiment, the lower mask may be provided with cooling channels. The cooling channels may be arranged to extend throughout the interior of a mask. Cooling channels may be milled into one plate of a material, for instance aluminum or stainless steel, and another plate is placed on top to seal off the channels. Moreover, the hoses providing and/or emptying a cooling fluid may be fluidly connected to a mask provided with cooling channels. By this embodiment, a mask may be actively cooled, thereby reducing and/or controlling its temperature to an accepted level during the heating of the metal sheet blank. The cooling fluid may be water. In an embodiment comprising the upper mask, also the upper mask may be provided with cooling channels.

According to a second aspect of the invention, a mask support arrangement for arrangement in a heating chamber is provided. The mask support arrangement may comprise a support structure. The support structure may be configured to be arranged in the heating chamber. The mask support arrangement may comprise a lower mask. The lower mask may be configured to be arranged to be moveable relative the support structure between a first position and a second position. The lower mask may be configured to receive a metal sheet blank. The lower mask may be adapted in shape and size to block radiation heating from reaching at least a first portion of a metal sheet blank. The lower mask may be adapted in shape and size to allow radiation heating to reach at least a second portion of the metal sheet blank and heat the same. The lower mask of the mask support arrangement may comprise a plurality of support projections. The support projections may project from a main surface of the lower mask towards the metal sheet blank when in a heating position. The support projections may be configured to support the metal sheet blank during heating thereof. By this mask support arrangement, heating stations already in use may be reconfigured into a heating station according to any of the embodiments of the first aspect of the invention.

According to one embodiment, the mask support arrangement may comprise a lifting device. The lifting device may be configured to control the movement of the lower mask between the first and second position. The lifting device may be powered by a pneumatic or electric actuator, preferably a servomotor driven linear unit.

According to one embodiment, the mask support arrangement may comprise an upper mask. The lifting device may be configured to control the movement of the upper mask between a first and second position.

Moreover, the mask support arrangement may be embodied in material, form, and functionality to correspond to the equivalent arrangement of the heating station according to any embodiments mentioned above, and benefit from the advantages these embodiments may provide. Here, by equivalent arrangement, it may be meant an arrangement that comprises all structural and functional features of the heating station with the exclusion of the heating chamber, as well as the lower and/or upper heating elements. In particular, it may be meant that the mask support arrangement comprises the lower mask, and the support frame of the heating station according to any of the embodiments of the first aspect of the invention.

According to a third aspect of the invention, a method of heating a metal sheet blank in a heating station is provided. The method may comprise the steps of:

arranging the metal sheet blank in a heating chamber of the heating station, supporting the metal sheet blank on support projections projecting from a main surface of a lower mask arranged in the heating chamber, heating the metal sheet blank using radiation heat from heating elements in the heating chamber, shielding at least a portion of the metal sheet blank from the radiation heat using the lower mask arranged in the heating chamber. Additionally, the method may comprise a step of moving the lower mask from a first position towards the upper mask to a second position.

According to one embodiment, the step of shielding at least a portion of the metal sheet blank from the radiation heating may further comprise shielding the metal sheet blank using an upper mask arranged in the heating chamber, and the lower and upper masks may be arranged on respective sides of the metal sheet blank.

According to one embodiment, the method may comprise a step of moving the lower mask from a first position towards a second position. The step of cooling may occur continuously throughout the step of heating. The lower mask may, in the first position, be positioned closer to the bottom of the heating chamber, preferably in a position where a metal sheet blank may be readily inserted into the heating chamber. In the second position, the lower mask may be arranged to support a metal sheet blank inserted into the heating chamber via the support projections during the heating thereof. The step of moving the lower mask may involve moving a metal sheet blank from an inserted position to a heating position. According to yet another embodiment, the lower mask is in the second position during the step of heating the metal sheet blank. This second step may be referred to as a heating position, as the metal sheet blank is supported to be positioned in a heating position. When being moved to the second position, the lower mask may be moved towards the upper mask.

According to yet another embodiment, the step of arranging the metal sheet blank in the heating chamber may comprise arranging the metal sheet blank on at least one support pin arranged in the heating chamber, and wherein the metal sheet blank is supported on said at least one support pin when the lower mask is in the first position, and on said support projections when the lower mask is moved to the second position.

According to yet another embodiment, the method may comprise a step of cooling either the upper or lower mask. The step of cooling may occur continuously throughout the step of heating.

According to yet another embodiment, the method may comprise a step of arranging a metal sheet blank into a furnace of some kind, for instance a multi-layer furnace, a chamber furnace or a roller hearth furnace. The method may comprise a step of heating the metal sheet blank in a heating chamber of the furnace. The metal sheet blank may be heated so that the material of the metal sheet blank reach austenitic phase. The method may comprise a step of removing the metal sheet blank from the furnace and transferring it to the heating station according to any of the embodiments above. This may for instance be done using a fork-type loading device. Alternatively, the furnace may comprise an ejection device which ejects the metal sheet blank when heated to an austenitization temperature into a position where it may be readily picked up, for instance by a fork-type loading device. Moreover, the method may comprise a step of processing during which the metal sheet blank is being press hardened. This may for instance be carried out by a tool of the processing unit which applies a force onto the metal sheet blank. Moreover, the method may comprise a step of cooling the metal sheet blank. When the tool closes, thereby reshaping the metal sheet blank, the metal sheet blank may be cooled to a temperature below martensite level. This cooling may be done rapidly. Hence, by the method, press hardened parts may be produced from metal sheet blanks.

According to yet one embodiment, the method may comprise a step of exchanging the upper and/or lower mask in the heating station. Additionally, the method may comprise a step of exchanging the support structure as well. By this embodiment, a heating station may be reconfigured to heat a metal sheet blank according to another required heating pattern.

According to a fourth aspect of the invention, a system for producing press hardened parts is provided. The system may comprise a furnace configured to heat the material of a metal sheet blank to an austenitic phase. The system may comprise a heating station according to any embodiments of the first aspect of the invention. The system may comprise a processing unit for press hardening the metal sheet blank to a press hardened part. The system may comprise a loading device for transferring a metal sheet blank between the furnace, the heating station and the processing unit. Moreover, the system may comprise a mask handling device for exchanging the upper mask, the lower mask, and/or the support structure. The system may comprise a cooling fluid reservoir and means for providing the cooling fluid to the upper and lower masks.

Moreover, although the first, the second, the third, and the fourth aspect have been summarized so as to pertain to the heating of a metal sheet blank, a plurality of metal sheet blanks may be naturally received by the mask support arrangement and/or the heating station and heated as well by the heating station. The plurality of metal sheet blanks may be heated simultaneously. Also, the method may concern heating and/or processing a plurality of metal sheet blanks as well, either in succession or simultaneously. Also, the heating station according to the first aspect of the invention may comprise a mask support arrangement according to the second aspect of the invention.

BRIEF DESCRIPTION OF THE DRAWINGS

The invention will in the following be described in more detail with reference to the enclosed drawings, wherein:

FIGS. 5a-5g show schematic block diagrams of an arrangement according to an embodiment of the invention;

DESCRIPTION OF EMBODIMENTS

Figure 1:
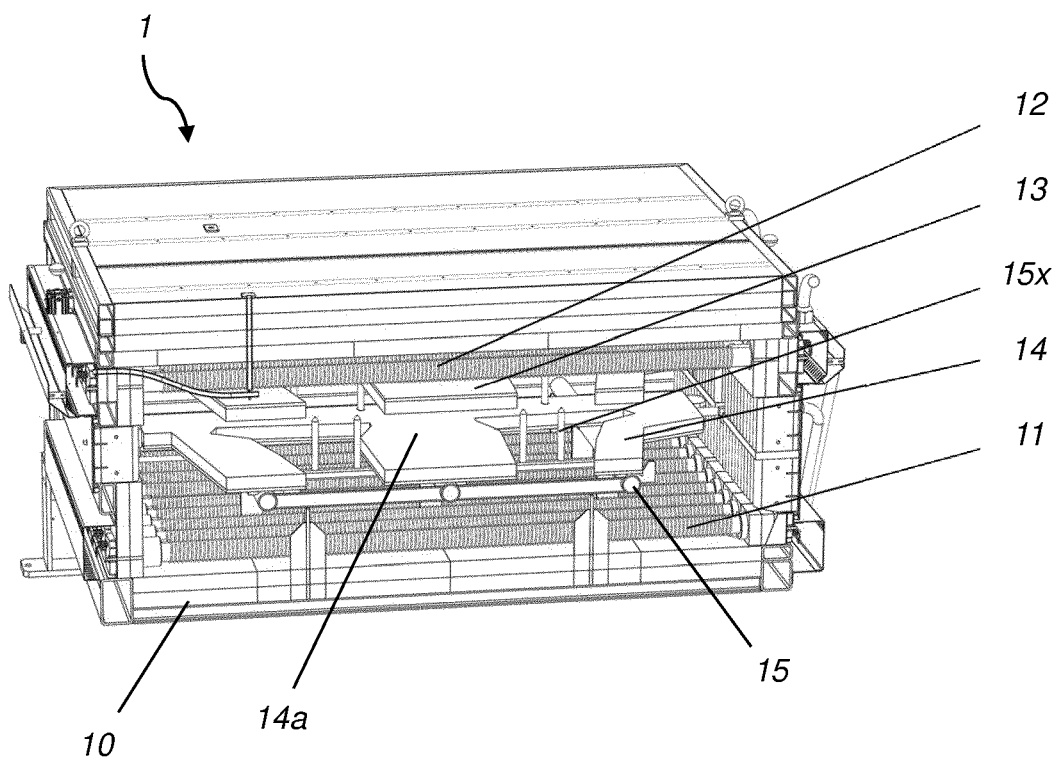
FIG. 1 shows a perspective view of a heating station according to an embodiment of the invention.

The present invention will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements. Moreover, in the drawings and specification, there have been disclosed preferred embodiments and examples of the invention and, although specific terms are employed, they are used in a generic and descriptive sense only and not for the purpose of limitation, the scope of the invention being set forth in the following claims.

Figure 2A:
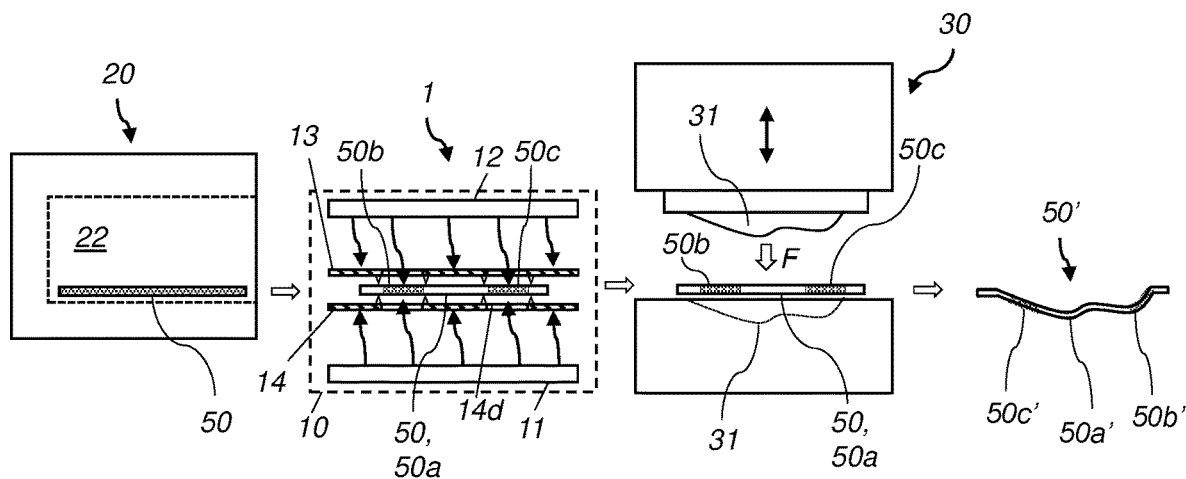
FIGS. 2a-2b show schematic block diagrams of an arrangement according to an embodiment of the invention.

FIG. 1 shows a perspective view of a heating station 1 according to an embodiment of the invention. FIG. 2a shows a schematic block diagram of a heating station 1 according to an embodiment of the invention. The heating station 1 comprises a heating chamber 10, i.e. a framework that holds thermal insulation and heating elements 11, 12. The heating station 1 comprises lower heating elements 11. The heating station 1 comprises upper heating elements 12. The lower heating elements 11 are arranged in a lower section of the heating chamber 10. The upper heating elements 12 are arranged in an upper section of the heating chamber 10. The lower heating elements 11 and the upper heating elements 12 are arranged a distance from one another, so that a metal sheet blank 50 may be placed between the lower heating elements 11 and the upper heating elements 12, see e.g. FIGS. 2a-2b. The lower and upper heating elements 11, 12 can be electrically powered, or fired with fuels, such as gases or oils. In other embodiments, the heating station 1 only comprises one of the lower and upper heating elements 11, 12.

The heating station 1 comprises a lower mask 14. The lower mask 14 is arranged in the heating chamber 10 above the lower heating elements 11 and below the metal sheet blank 50 when the metal sheet blank 50 is inserted into the heating chamber 10. The lower mask 14 is configured to block radiation heating from reaching at least a first portion of the metal sheet blank 50. Moreover, the lower mask 14 comprises at least one opening or recess 14b, 14c through which radiation heating may reach at least a second portion of the metal sheet blank 50. Also, the lower mask 14 comprises a plurality of support projections 14d projecting from a main surface 14a of the lower mask 14 (not shown in FIG. 1). The main surface 14a may be an upper surface of the lower mask 14 as seen in FIG. 1. The support projections 14d projects in an upward direction, and toward a metal sheet blank 50 when inserted into the heating chamber 10. The support projections 14d are configured to support the metal sheet blank 50 during heating thereof. Furthermore, the heating station 1 comprises an upper mask 13. In one embodiment, the upper mask 13 is arranged in the heating chamber 10 below the upper heating elements 12 and above the metal sheet blank 50 when the metal sheet blank 50 is inserted into the heating chamber 10. The upper mask 13 is configured to block radiation heating from reaching at least a third portion of the metal sheet blank 50. Moreover, the upper mask 13 comprises at least one opening or recess 13b, 13c through which radiation heating may reach at least a fourth portion of the metal sheet blank 50.

The arrangement 1, i.e. the heating station 1, comprises a heating chamber 10, lower and upper heating elements 11, 12, and upper and lower mask 13, 14, as previously specified in reference to FIG. 1. The heating station 1 is configured to receive a metal sheet blank 50. The metal sheet blank 50 may have been preheated prior to being received by the heating station 1. For instance, the metal sheet blank 50 may be heated in a heating chamber 22 of a furnace 20 to a temperature equal to or above the austenitization temperature of the material of blank 50, thereby putting the material of the blank 50 into an austenitic phase. The metal sheet blank 50 may then be moved from the heating chamber 22 of the furnace 20 to the heating station 1.

In the heating chamber 10 of the heating station 1, when the metal sheet blank is in a position to be heated by the lower and upper heating elements 11, 12, i.e. a heating position, the metal sheet blank 50 is supported by the support projections 14d. The support projections 14d allow air to circulate between the mask 14 and the metal sheet blank 50. The lower and upper heating elements 11, 12 provide radiation heating. Some radiation heating is able to reach the at least one exposed zone 50b, 50c of the metal sheet blank 50 (regions indicated by mesh patterns in FIG. 2a), while at least one non-exposed zone 50a of the metal sheet blank 50 is prevented from receiving heating radiation due to the upper and lower masks 13, 14.

After the at least one exposed zone 50b, 50c has been heated, the metal sheet blank 50 is removed from the heating chamber 10 of the heating station 1. The metal sheet blank 50 may then be moved from the heating chamber 10 of the heating station 1 to a processing unit 30. In the processing unit 30, the metal sheet blank 50 is arranged in a tool 31 of the processing unit 30. By being pressed by a pressing force F, and possibly quenched, the metal sheet blank 50 is formed to a press hardened part 50'. The press hardened part 50' is provided with a hardened zone 50b', 50c' corresponding to the heated zone 50b, 50c.

Figure 2B:
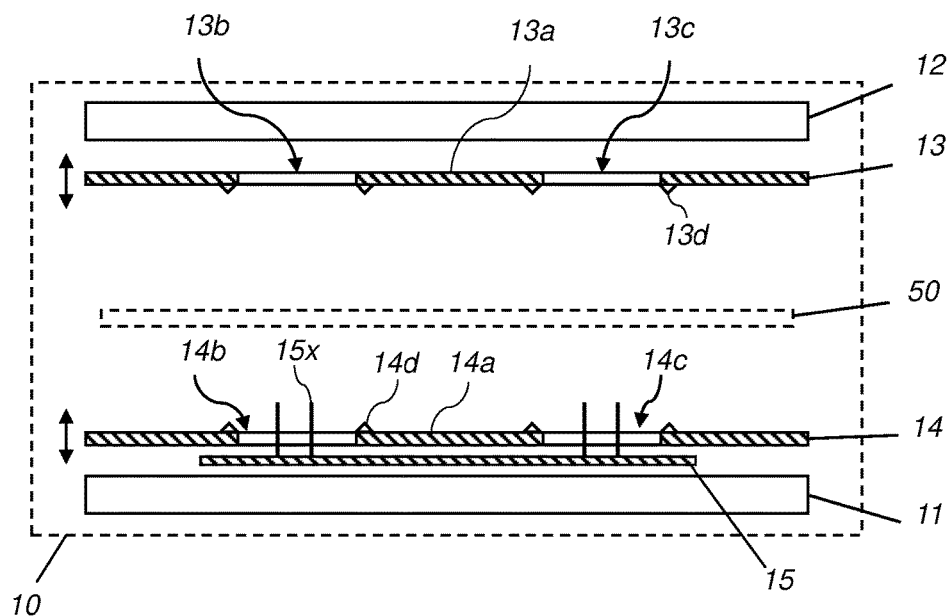

FIG. 2b shows a schematic block diagram of an arrangement 1 according to an embodiment of the invention. The arrangement 1, i.e. the heating station 1, comprises lower and upper heating elements 11, 12, upper and lower masks 13, 14 as described in reference to FIG. 1. The heating station 1 is configured to receive a metal sheet blank 50 between the lower and upper heating elements 11, 12, and in particular in between the upper and lower mask 13, 14 as depicted in FIG. 2b by dashed contour. The lower mask 14 comprises at least one opening or recess 14b, 14c. The upper mask 13 also comprises at least one opening or recess 13b, 13c. Radiation heating may reach a metal sheet blank 50 inserted into the heating chamber 10 through the opening or recess 13b, 13c, 14b, 14c of the upper and lower mask respectively. The lower mask 14 is provided with support projections 14d projecting out from a main surface 14a of the lower mask 14. The main surface 14a of the lower mask may be its upper surface as seen in FIG. 2b. The support projections 14d are configured to support the metal blank sheet 50 during the heating thereof. The support projections 14d allow air to ventilate between the lower mask 14 and the metal sheet blank 50 during heating thereof.

Figure 3A:
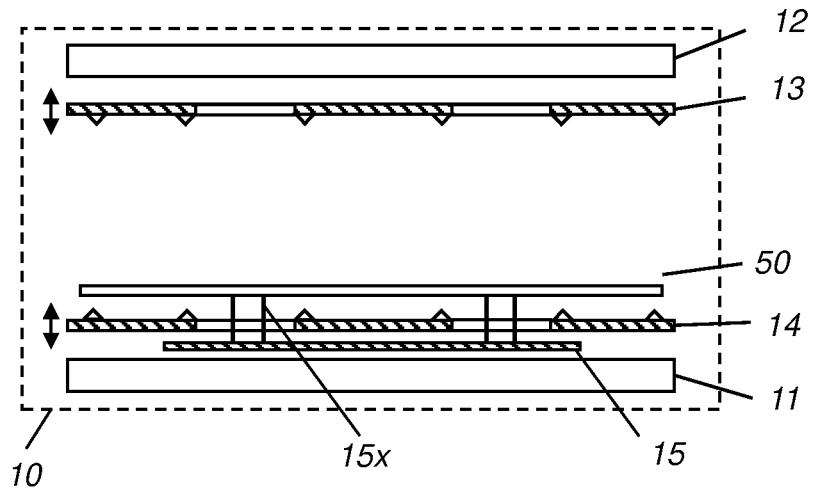
FIGS. 3a-3c show schematic block diagrams of an arrangement according to an embodiment of the invention.
Figure 3B:
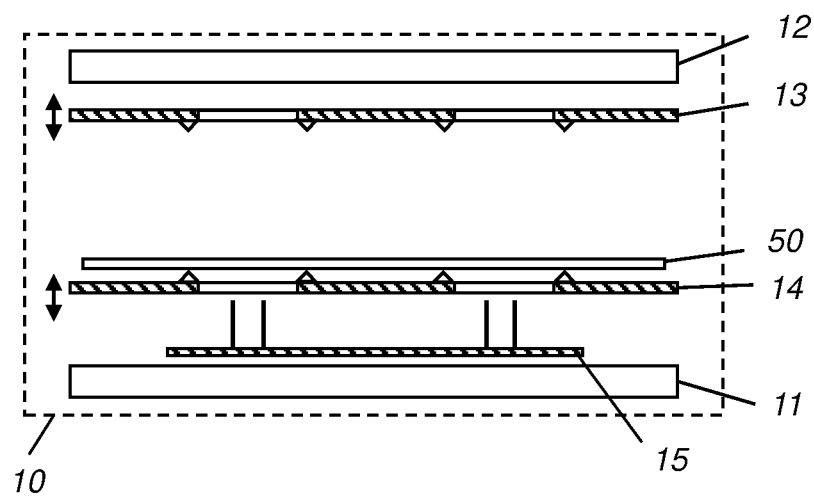
Figure 3C:
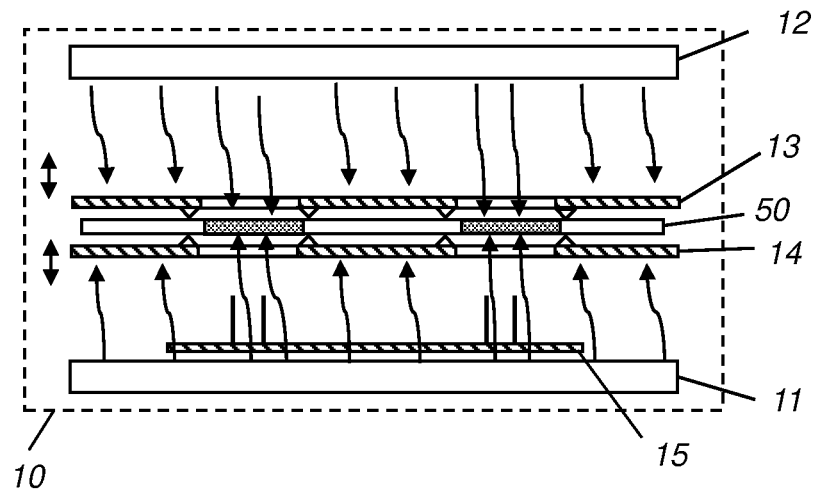

Moreover, the lower mask 14 is configured to be moveable relative the heating chamber 10 of the heating station 1, as depicted in FIG. 3a-3c. The lower mask 14 is configured to be moveable from a first position and a second position, wherein the lower mask 14 in the first position is positioned closer to the bottom of the heating chamber 10, preferably in an inserting position where a metal sheet blank 50 may be readily inserted into the heating chamber 10 on a support structure 15 as depicted in FIGS. 2b and 3a. The lower mask 14 is configured to move toward the upper mask 13 so that the support projections 14d support the metal sheet blank 50, as depicted in FIG. 3b. In the second position, i.e. a heating position, the lower mask 14 is arranged to support a metal sheet blank 50 inserted into the heating chamber 10 during the heating thereof, as depicted in FIG. 3c.

In one exemplary embodiment, the upper mask is stationary in a position while the lower mask 14 moves towards the upper mask 13 carrying the metal sheet blank 50 in a heating position. Optionally, the upper mask 13 is also configured to be moveable relative the heating chamber 10 of the heating station 1. The upper mask 13 may then be moveable between a first position and a second position. The upper mask 13 may in the first position be in a locked position, locked in place by locking means 13x. The upper mask 13 may in the second position be supported by the lower mask 14 placed in a first position. In a further exemplary embodiment, the upper mask 13 is configured to be moveable toward the lower mask 14 while the lower mask 14 moves towards the upper mask 13 while supporting the metal sheet blank 50. Optionally, the upper mask 13 comprises distance projections 13d projecting out from a main surface of the upper mask 13. The main surface of the upper mask 13 may be a bottom surface of the upper mask 13. The distance projections 13d and the support projections 14d may hold the metal sheet blank 50 in place during heating thereof. The upper and lower masks 13, 14 may be provided in aluminum or stainless steel. Moreover, the upper and lower masks 13, 14 may be provided with cooling channels for cooling the upper and lower masks 13, 14. The cooling may be done by moving a fluid throughout the cooling channels to transfer heat away from the upper and lower masks 13, 14. The cooling channels may extend throughout in various directions in the interior of the upper and lower masks 13, 14. The cooling fluid may be water.

As is illustrated in FIGS. 1, 2b, 3a-3c, 4a-4b, the heating station 1 may comprise support pins 15x extending through said at least one opening or recess 14b, 14c of the lower mask 14. The lower mask 14 may be provided with support pin apertures 14e through which support pins 15x may extend through. Moreover, the upper mask 13 may also be provided with support pin apertures 13e through which support pins 15x may extend through. The support pin apertures 13e, 14e may be shaped in size and form to tightly receive support pins 15x and allow these to be moved in and out of the support pin apertures 13e, 14e. The support pins 15x are configured to support the metal sheet blank 50 when arranged in the heating chamber 10 of the heating station 1. Moreover, the support pins 15x may be configured to support the metal sheet blank 50 so that the lower mask 14, as it moves toward the upper mask 13, may readily receive and support the metal sheet blank 50 during heating thereof.

Figure 4A:
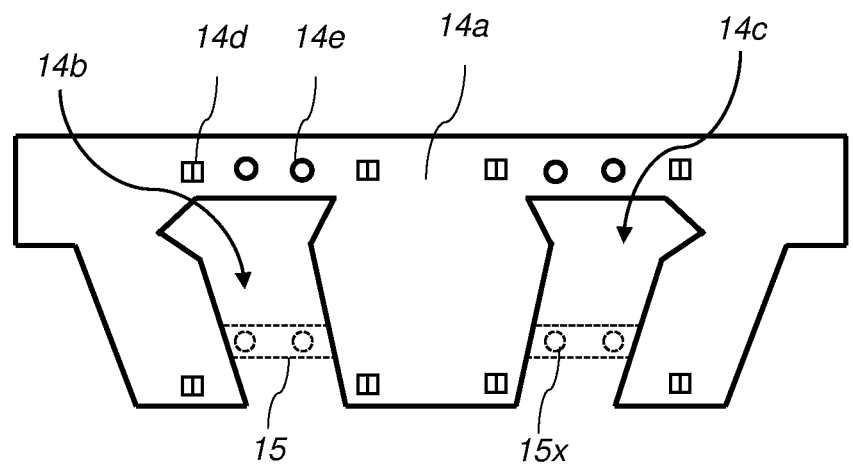
FIGS. 4a-4b show schematic block diagrams of a part of an arrangement according to an embodiment of the invention.

FIG. 4a shows a schematic illustration of a part 14 of an arrangement 1 according to an embodiment of the invention. The part 14, i.e. the lower mask 14, is depicted in an exemplary shape as seen from above. The lower mask 14 is provided with a main surface 14a being the top surface of the lower mask 14. Moreover, the lower mask 14 may comprise at least one opening or recess 14b, 14c through which heating radiation may reach a metal sheet blank 50 inserted into the heating chamber 10. Moreover, the lower mask 14 comprises support projections 14d arranged along the main surface of the lower mask 14 to support a metal sheet blank 50 during heating thereof. The lower mask 14 may be provided with support pin apertures 14e through which support pins 15x may extend through. The support pin apertures 14e may be shaped in size and form to tightly receive support pins 15x and allow these to be moved in and out of the support pin apertures 14e. In one exemplary embodiment, the support pin apertures 14e are circular apertures. Also, the support pins 15x may be provided on a support structure 15 (indicated by dashed lines). The support structure 15 may comprise the support pins 15x.

Figure 4B:
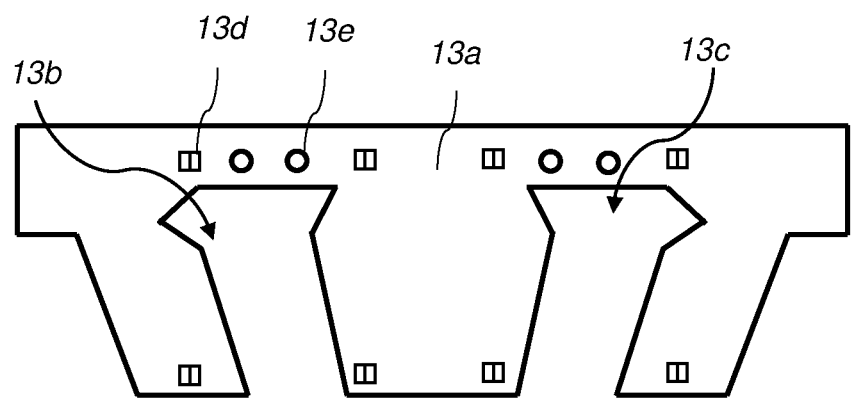

FIG. 4b shows a part 13 of an arrangement 1 according to an embodiment of the invention. The part 13, i.e. the upper mask 13, is depicted in an exemplary shape as seen from below. The upper mask 13 is provided with a main surface 13a being the bottom surface of the upper mask 13. Moreover, the upper mask 13 comprises at least one opening or recess 13b, 13c through which heating radiation may reach a metal sheet blank inserted into the heating chamber 10. Moreover, the upper mask 13 may comprise distance projections 13d arranged along the main surface of the upper mask 13 to abut a metal sheet blank 50 during heating thereof (not shown). Likewise, the upper mask 13 may also be provided with support pin apertures 13e through which support pins 15x may extend through.

Moreover, the upper and lower masks 13, 14 may be exchangeable from the heating station 1. Thereby, a heating station 1 may be configured with a set of upper and lower masks 13, 14 chosen from a collection of sets of upper and lower masks 13, 14 being different with respect to material, size and/or form, and with respect to the openings or recesses 13b, 13c, 14b, 14c through which radiation heating is able to reach the metal sheet blank during heating thereof. The support structure 15 may be exchangeable as well.

FIGS. 5a-5g show a block diagram of an arrangement 1 according to one embodiment of the invention. The arrangement 1, i.e. the heating station 1, is shown as seen from the side. Moreover, FIGS. 5a-5g illustrate how a set of upper and lower masks 13, 14 are exchanged to a new set of upper and lower masks 13', 14'. A new set of upper and lower masks 13', 14' is usually required when a new type of press hardened part 50' is to be manufactured.

"FIG. 5a shows the heating station 1 when the lower mask 14 is in a first position and the upper mask 13 is in a locked position. The upper mask 13 is locked in position by the locking means 13x. The lower mask 14 is moved upwards to the upper mask 13 so that it touches the upper mask 13, as seen in FIG. 5b. Then, the upper mask 13 is released from the locking means 13x as seen in FIG. 5c. The upper mask 13 is now supported by the lower mask 14. The lower mask 14 moves downward carrying the upper mask 13 into a releasing position as seen in FIG. 5d. The support pins 15x is in one embodiment configured to project through support pin apertures 14e, 13e of both the lower mask 14 and the upper mask 13. The upper mask 13, the lower mask 14, and the support structure 15 may all be removed from the heating chamber 10 of the heating station 1 as shown in FIG. 5e. The interior of the heating chamber 10 may be accessed by a hatch. The hatch may be opened so that the upper mask 13, the lower mask 14, and the support structure 15 may be removed. The hatch may then be closed to preserve heat in the heating chamber 10. The upper mask 13, the lower mask 14, and the support structure 15 may be removed using a mask handling device (not shown). The mask handling device may be configured to remove the upper mask 13, the lower mask 14, and the support structure 15 from the heating chamber 10. The mask handling device may be configured to remove the upper mask 13, the lower mask 14 and the support structure 15 and place it in a storage unit. Moreover, the mask handling device may be configured to fetch a new set of an upper mask 13', a lower mask 14', and a support structure 15' as shown in FIG. 5f, possibly from the storage unit. The new set of an upper mask 13', a lower mask 14', and a support structure 15' is arranged in the heating chamber 10 of the heating station 1, and the lower mask 14' is moved upward carrying the upper mask 13'. The upper mask 13' is fixated in place using the locking means 13x. The lower mask 14' is then moved to the first position again. The locking means 13x holding the upper mask 13, 13' may be configured to automatically release the upper mask 13 when the upper mask is pushed upward by the lower mask. The locking means 13x may further be configured to automatically fix new the upper mask 13' when the upper mask 13' reach contact with the locking means 13x.

Moreover, FIGS. 5a-5g additionally exemplifies a mask support arrangement 40. The mask support arrangement 40 comprises a support structure 15 and a lower mask 14 configured to be arranged to be moveable relative the support structure 15 between a first position and a second position. Moreover, the mask support arrangement 40 may comprise an upper mask 13. The mask support arrangement 40 may be exchangeable for a mask support arrangement 40' having a different set of upper and lower masks 13', 14'.

Figure 6:
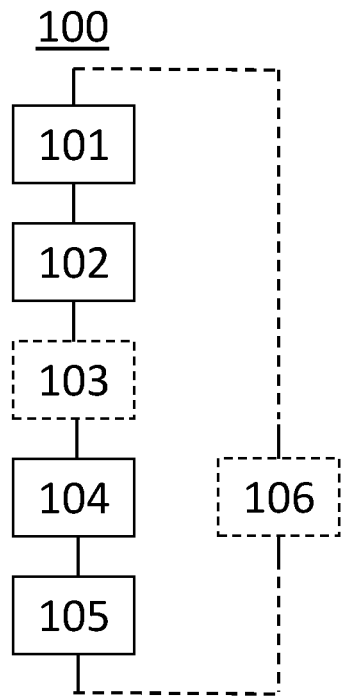
FIG. 6 shows a flow chart of a method according to an embodiment of the invention.

FIG. 6 shows a flow chart of a method 100 according to an embodiment of the invention. The method 100 of heating a metal sheet blank 50 in a heating station 1 according to any embodiments of the first aspect of the invention comprises a step of arranging 101 a metal sheet blank 50 in a heating chamber 10 of the heating station 1. The method 100 comprises a step of supporting 102 the metal sheet blank 50 on support projections 14d projecting from a main surface 14a of a lower mask 14 arranged in the heating chamber 10. The method 100 comprises a step of heating 104 the metal sheet blank 50 using radiation heating from heating elements 11, 12 in the heating chamber 10. The method 100 comprises a step of shielding 105 at least a portion of the metal sheet blank 50 from the radiation heating using the lower mask 14 and an upper mask 13 arranged in the heating chamber 10, wherein the lower and upper masks 14, 13 are arranged on respective opposite sides of the metal sheet blank 50. Additionally, the method 100 may comprise a step of moving 103 the lower mask 14 from a first position towards the upper mask 13 to a second position. The lower mask 14 may, in the first position, be positioned closer to the bottom of the heating chamber 10, preferably in a position where a metal sheet blank 50 may be readily inserted into the heating chamber 10. In the second position, the lower mask 14 may be arranged to support a metal sheet blank 50 inserted into the heating chamber via the support projections 14d during the heating thereof. The step of moving 103 the lower mask 14 may involve moving a metal sheet blank 50 from an inserted position to a heating position. Moreover, the method 100 may comprise a step of cooling 106 the upper and/or lower masks 13, 14. The step of cooling 106 the upper and/or lower masks 13, 14 may occur before step 101, after step 105, or anywhere in between. The step of cooling 106 may occur continuously throughout the step of heating 104.

Figure 7:
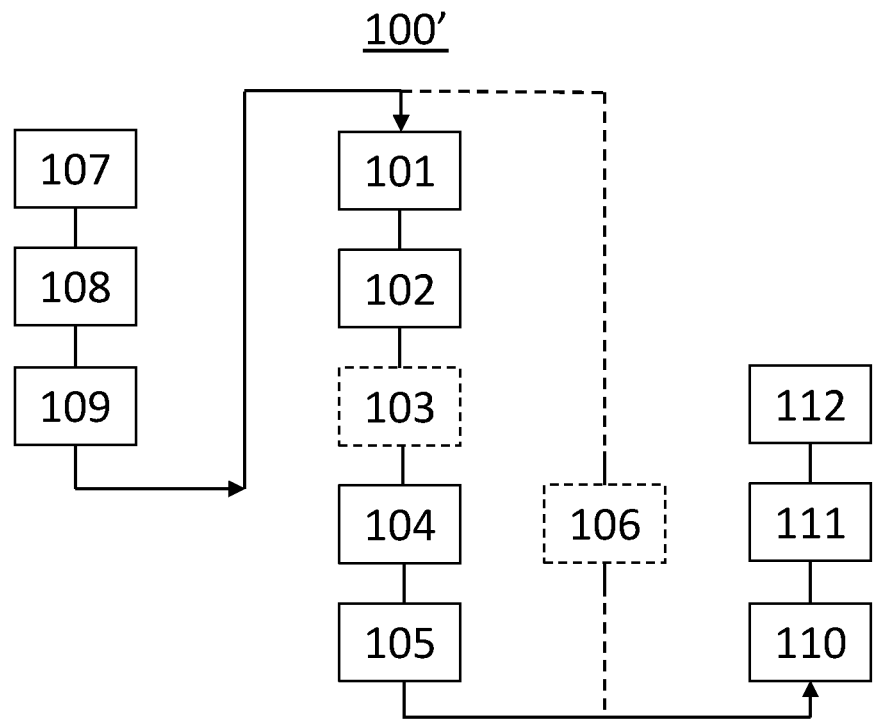
FIG. 7 shows a flow chart of a method according to an embodiment of the invention.

FIG. 7 shows a flow chart of a method 100' according to an embodiment of the invention. The method 100' may comprise a step of arranging 107 a metal sheet blank into a furnace 20 of some kind, for instance a multi-layer furnace, a chamber furnace or a roller hearth furnace. The method 100' may comprise a step of heating 108 the metal sheet blank 50 in a heating chamber 22 of the furnace 20. The metal sheet blank 50 may be heated so that the material of the metal sheet blank 50 reach austenitic phase. Moreover, if the metal sheet blank 50 is coated by a coating material, the chemical transformation of the coating may be initiated during the step of heating 108 and may not necessarily be completed. The method 100' may comprise a step of removing 109 the metal sheet blank 50 from the furnace 20. This may for instance be done using a fork-type loading device. Alternatively, the furnace 20 may comprise an ejection device which ejects the metal sheet blank 50 when heated to an austenitization temperature into a position where it may be readily picked up, for instance a fork-type loading device. The austenitic metal sheet blank 50 is then transferred to the heating station 1. The method 100' may comprise the steps 101, 102, 103, 104, 105, 106 of method 100. When the metal sheet blank 50 is to be transferred into the heating station 1, the heating chamber door opens and the fork loading device traverses horizontally into the heating station 1, hereafter lowering the metal sheet blank 50 onto the supporting pins 15x of the heating station 1. The fork loading device is then pulled out of the heating station 1, and the door is closed with the metal sheet blank 50 left inside the heating chamber 10. The lower mask 14 is now moved 103 upwards to the metal sheet blank 50. The lower mask 14 interacts with the metal sheet blank 50 lifting it from the support pins 15x. The lower mask 14 now carries the metal sheet blank 50 via the supporting projections 14d which are configured such that the lower mask 14 receives the metal sheet blank 50 in a predetermined position. The predetermined position may for instance be a horizontal orientation. The lower mask 14 and the metal sheet blank 50 together continue the lifting motion towards the upper mask 13. When the lower mask 14 has reached a position next to the upper mask 13, keeping the metal sheet blank in a predetermined position in between them, the step of heating 104 is initiated. The region(s) where the metal sheet blank 50 is exposed to radiant heat from the lower heating elements 11 and the upper heating elements 12 may be heated such that the temperature(s) of the region(s) remain in the austenitic level. The region(s) which are covered by the masks may then start to cool off slowly. The step of heating 104 may be complete when the covered region(s) has cooled to a temperature between austenitic level and a martensitic level. Thereafter, the lower mask 14 may initiate a movement from the second position to the first position, carrying the metal sheet blank 50 downward. The metal sheet blank 50 is received by the supporting pins 15x, while the lower mask 14 moves fully to the first position, in which position the metal sheet blank 50 is readily removable from the heating chamber 10. The door of the heating chamber 10 may be opened and the fork loading device may then move the metal sheet blank 50 out of the heating station 1. The method 100' may further comprise a step of arranging 110 the metal sheet blank in a processing unit 30. This may for instance be carried out by the fork loading device as well. Moreover, the method 100' may comprise a step of processing 111 during which the metal sheet blank is being press hardened. This may for instance be carried out by a tool 31 of the processing unit 30 which applies a force F onto the metal sheet blank. Moreover, the method 100' may comprise a step of cooling 112 the metal sheet blank 50. When the tool 31 closes, thereby reshaping the metal sheet blank 50, the metal sheet blank 50 may be cooled to a temperature below martensite level. This cooling 112 may be done rapidly. Hence, by the method 100', press hardened parts 50' may be produced from metal sheet blanks 50.

Figure 8:
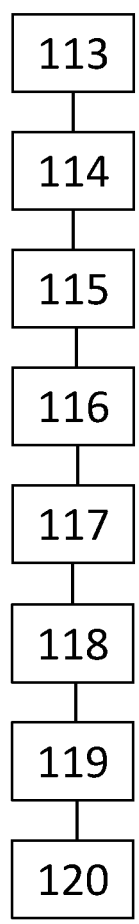
FIG. 8 shows a flow chart of a method according to an embodiment of the invention.

FIG. 8 shows a flow chart of a method according to one embodiment of the invention. The method 100" relates to a procedure of exchanging a mask set. Any steps of the method 100" may be incorporated into either the method 100, or the method 100'. The method 100" may comprise a step of turning off the heating power of the heating station 1. The method 100" may comprise a step of making ready a mask handling unit outside the heating station 1. The method 100" may comprise a step of moving 113 the lower mask 14 toward the upper mask 13, so that it touches the upper mask 13. The method 100" may comprise a step of releasing 114 the upper mask 13 from its fixation points. The method 100" may comprise a step of supporting 115 the upper mask 13 using the lower mask 14. The method 100" may comprise a step of moving 116 the lower mask 14 supporting the upper mask 13 to a releasing position. The releasing position may be the first position of the lower mask 14. The method 100" may comprise a step of disconnecting cooling water hoses that are either directly or indirectly connected to either the upper or lower masks 13, 14 or both. The method 100" may comprise a step of opening the heating chamber 10. The method 100" may comprise a step of removing 117 the lower mask 14 supporting the upper mask 13 from the heating chamber 10. The method 100" may comprise a step of closing the heating chamber 10 once the lower mask 14 supporting the upper mask 13 has been removed from the heating chamber 10. This may help to preserve the heat in the heating chamber 10. The method 100" may comprise a step of storing the removed set of upper and lower masks 13, 14. The method 100" may comprise a step of opening the heating chamber 10. The method 100" may comprise a step of inserting 118 a new set of upper and lower masks 13', 14' into the heating chamber 10 in an inserting position. Moreover, the support structure 15 may also be removed with the old set of upper and lower masks 13, 14. A support structure 15' compatible with the new set of upper and lower masks 13', 14' may be inserted with the upper and lower masks 13', 14'. The upper and lower masks 13', 14' may be inserted so that the upper mask 13' is supported by the lower mask 14'. The method 100" may comprise a step of closing the heating chamber 10 once the new set of upper and lower masks 13', 14', and optionally the support structure 15 have been inserted into the heating chamber 10. The method 100" may comprise a step of moving 118 the lower mask 14' supporting the upper mask 13' from the inserting position upwards. The method 100" may comprise a step of locking 119 the upper mask 13' in its fixation points. The method 100" may comprise a step of moving 120 the lower mask 13' to a first position, i.e. a receiving position. By performing the method 100", a heating station may advantageously be reconfigured to produce a different press hardened part 50'.

Figure 9:
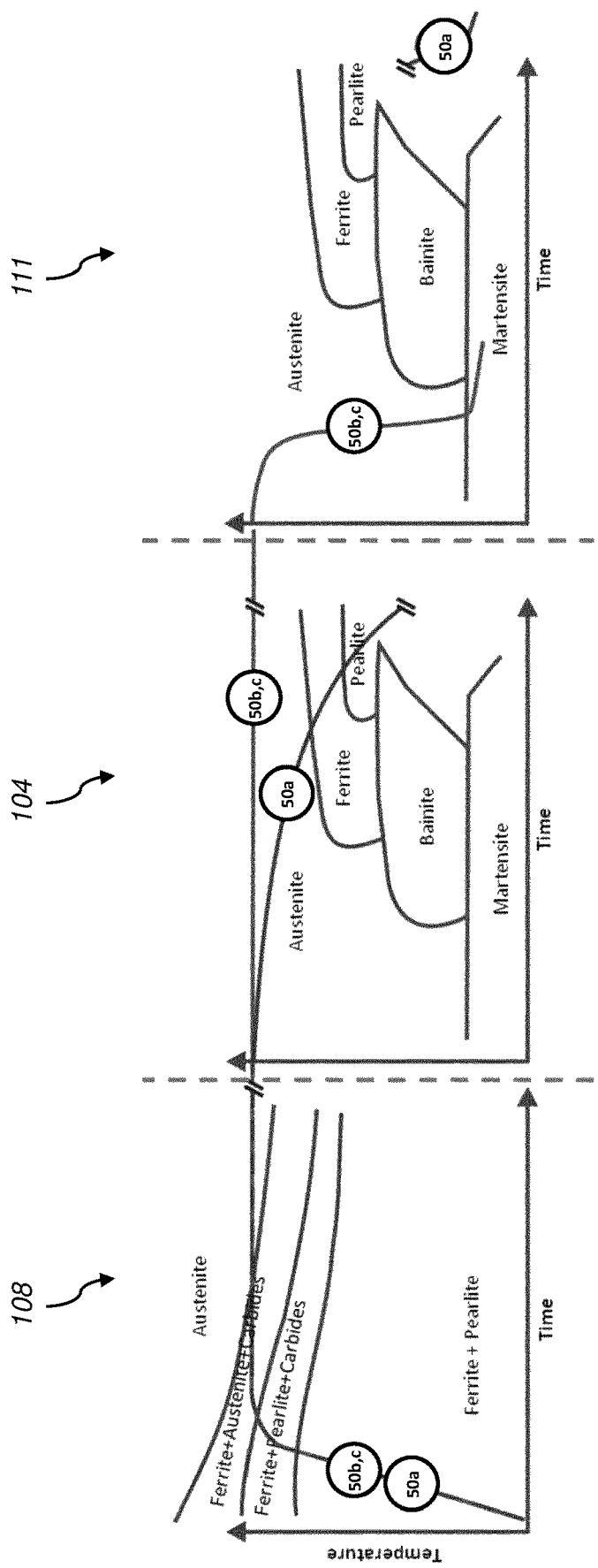
FIG. 9 shows a schematic diagram of the internal structure of a blank during a method process according to an embodiment of the invention.

FIG. 9 shows a schematic diagram of the internal structure of a metal sheet blank during a method process according to an embodiment of the invention. In the figure, the temperature of the at least one exposed zone 50b, 50c of the blank 50 outside the at least one non-exposed zone 50a and the temperature of the at least one non-exposed zones 50a of the blank 50 is illustrated. In the first stage 108, the entire metal sheet blank 50 is heated in a furnace 20 to the austenitic phase. This includes heating the metal sheet blank 50 to a temperature equal to or above the austenitic temperature of the blank, and possibly keeping the metal sheet blank 50 at this temperature for an amount of time. In the second stage 104, the metal sheet blank 50 has been moved to the heating station 1 in which the at least one exposed zone 50b, 50c is kept at a temperature keeping it in the austenitic phase. Such temperature may be below, equal to or above the austenitic temperature. The at least one non-exposed zone 50a is cooling reaching ferrite, pearlite and bainite phase. In the third stage 111, the metal sheet blank 50 is formed and quenched in a processing unit 30. When the at least one exposed zone 50b, 50c is rapidly cooled from the austenitic phase, it reaches martensite phase. When the at least one non-exposed zone 50a is quenched, it stays in the pearlite phase which it had reached when previously been cooling. However, the at least one exposed zone 50b, 50c may, before being quenched, have a mixture of ferrite, pearlite, bainite and/or austenite. Depending on the composition of phase in the at least one exposed zone 50b, 50c before quenching, the internal structure and material strength becomes different.

In the drawings and specification, there have been disclosed preferred embodiments and examples of the invention and, although specific terms are employed, they are used in a generic and descriptive sense only and not for the purpose of limitation, the scope of the invention being set forth in the following claims.

The invention claimed is:

1. A heating station for heating a metal sheet blank, comprising a heating chamber,
   lower heating element arranged in the heating chamber below a metal sheet blank when in a heating position, and configured to provide radiation heating towards the metal sheet blank, and
   a lower mask arranged in the heating chamber below the metal sheet blank, adapted in shape and size to, when in the heating position, block the radiation heating from reaching at least a first portion of the metal sheet blank, and to allow radiation heating to reach at least a second portion of the metal sheet blank and heat the same,
   wherein the lower mask comprises a plurality of support projections projecting from a main surface of the lower mask towards the metal sheet blank when in a heating position, which support projections are configured to support a bottom side of the metal sheet blank during heating of the metal sheet blank,
   wherein the lower mask is operatively moveable from a first heating position towards a second heating position.

2. The heating station according to claim 1, wherein the heating station comprises both the lower heating element arranged below the metal sheet blank and upper heating element arranged above the metal sheet blank when in the heating position, and wherein the heating station further comprises an upper mask arranged in the heating chamber between the upper heating element and the metal sheet blank, adapted in shape and size to, when in the heating position, block radiation heating from reaching at least a third portion of the metal sheet blank, and to allow radiation heating to reach at least a fourth portion of the metal sheet blank and heat the same.

3. The heating station according to claim 2, wherein the upper mask comprises distance projections projecting from a main surface of the upper mask towards the metal sheet blank when in the heating position.

4. The heating station according to claim 1, wherein the lower mask comprises at least one opening or recess through which radiation heating may reach the second portion of the metal sheet blank and heat the same.

5. The heating station according to claim 4, further comprising support pins extending through said at least one opening or recess in the lower mask and configured to support the metal sheet blank inserted in the heating station.

6. The heating station according to claim 5, wherein the heating station is configured to receive the metal sheet blank so that it is supported by said support pins when the lower mask is in the first position, and wherein the heating station is configured to support the metal sheet blank by said support projections when the lower mask is moved to the second position.

7. The heating station according to claim 5, wherein the support pins are arranged on a support structure, wherein the support structure is exchangeable from the heating station.

8. The heating station according to claim 1, wherein the lower mask is made of steel or aluminum.

9. The heating station according to claim 1, wherein the lower mask is exchangeable from the heating station.

10. The heating station according to claim 1, wherein the lower mask is provided with cooling channels.

11. A method of heating a metal sheet blank in the heating station according to claim 1, comprising the steps of:
   arranging the metal sheet blank in the heating chamber of the heating station,
   supporting the metal sheet blank on support projections projecting from the main surface of the lower mask arranged in the heating chamber,
   heating the metal sheet blank using radiation heating from heating elements in the heating chamber, and
   shielding at least the first portion of the metal sheet blank from the radiation heating using the lower mask arranged in the heating chamber.

12. The method according to claim 11, wherein the step of shielding at least the first portion of the metal sheet blank from the radiation heating further comprises shielding the metal sheet blank using an upper mask arranged in the heating chamber, and wherein the lower and upper masks are arranged on respective opposite sides of the metal sheet blank.

13. The method according to claim 11, further comprising a step of moving the lower mask from the first position towards the second position, wherein the lower mask is in the second position during the step of heating the metal sheet blank.

14. The method according to claim 13, wherein the step of arranging the metal sheet blank in the heating chamber comprises arranging the metal sheet blank on support pins arranged in the heating chamber, and wherein the metal sheet blank is supported on said support pins when the lower mask is in the first position, and on said support projections when the lower mask is moved to the second position.

15. The method according to claim 11, further comprising a step of cooling the lower mask.

16. A mask support arrangement for arrangement in a heating chamber, the mask support arrangement comprising:
   a support structure arranged in the heating chamber, and
   a lower mask moveable relative the support structure between a first position and a second position, and configured to receive a metal sheet blank, the lower mask adapted in shape and size to block radiation heating from reaching at least a first portion of a metal sheet blank, and to allow radiation heating to reach at least a second portion of the metal sheet blank and heat the same,
   wherein the lower mask of the mask support arrangement comprises a plurality of support projections projecting from a main surface of the lower mask towards the metal sheet blank when in a heating position, which support projections are configured to support a bottom side of the metal sheet blank during heating of the metal sheet blank.

\* \* \* \* \*